(12) United States Patent
Rainbow et al.

(10) Patent No.: US 11,139,639 B1
(45) Date of Patent: Oct. 5, 2021

(54) MODULAR POWER DISTRIBUTION ASSEMBLY AND METHOD OF ASSEMBLY THEREOF

(71) Applicant: GE Aviation Systems Limited, Gloucestershire (GB)

(72) Inventors: Alexander James Rainbow, Swindon (GB); Michael James Smith, Chadlington (GB)

(73) Assignee: GE Aviation Systems Limited, Gloucestershire (GB)

( * ) Notice: Subject to any disclaimer, the term of this patent is extended or adjusted under 35 U.S.C. 154(b) by 0 days.

(21) Appl. No.: 16/925,001

(22) Filed: Jul. 9, 2020

(51) Int. Cl.
*H02B 1/20* (2006.01)
*H02B 1/04* (2006.01)
*H02J 4/00* (2006.01)
*B64D 41/00* (2006.01)
*H05K 7/14* (2006.01)

(52) U.S. Cl.
CPC .............. *H02B 1/04* (2013.01); *B64D 41/00* (2013.01); *H02B 1/20* (2013.01); *H02J 4/00* (2013.01); *H05K 7/1457* (2013.01); *B64D 2221/00* (2013.01)

(58) Field of Classification Search
None
See application file for complete search history.

(56) References Cited

U.S. PATENT DOCUMENTS

| | | | |
|---|---|---|---|
| 5,969,965 A * | 10/1999 | Byrne | H05K 7/1432 363/144 |
| 6,504,730 B1 | 1/2003 | Cooney et al. | |
| 6,937,461 B1 | 8/2005 | Donahue, IV | |
| 7,437,496 B2 * | 10/2008 | Oster | G06F 13/409 361/728 |
| 7,891,993 B2 | 2/2011 | Huber et al. | |
| 8,031,486 B2 | 10/2011 | Wavering et al. | |
| 10,541,941 B2 * | 1/2020 | Adiletta | H04B 1/40 |
| 2010/0041277 A1 | 2/2010 | Huber et al. | |
| 2014/0315401 A1 * | 10/2014 | Blasbalg | H02B 1/21 439/110 |
| 2016/0044779 A1 * | 2/2016 | Soffer | H05K 1/0284 361/764 |
| 2016/0233650 A1 * | 8/2016 | Baillargeon | H02B 3/00 |
| 2018/0145485 A1 | 5/2018 | Fischer et al. | |
| 2019/0052081 A1 * | 2/2019 | Rainbow | B64D 31/02 |
| 2019/0075676 A1 * | 3/2019 | Anderson | H05K 7/1401 |
| 2019/0346900 A1 | 11/2019 | Hutchings et al. | |
| 2019/0393640 A1 * | 12/2019 | Steinberger | H02B 1/0523 |

FOREIGN PATENT DOCUMENTS

WO     2018125896 A2     7/2018

* cited by examiner

*Primary Examiner* — Courtney L Smith
(74) *Attorney, Agent, or Firm* — McGarry Bair PC

(57) ABSTRACT

A modular power distribution apparatus and method includes a frame defined by a first set of parallel supports and a second set of parallel supports, the second set of parallel supports connecting the first set of parallel supports, the frame defining a generally planar assembly defining a first side and a second side opposite the first side, as well as a set of components extending from a side of the frame and operably coupled to the frame. The set of components includes a set of power modules.

20 Claims, 4 Drawing Sheets

MODULAR POWER DISTRIBUTION ASSEMBLY AND METHOD OF ASSEMBLY THEREOF

TECHNICAL FIELD

The disclosure generally relates to power distribution assemblies, and more specifically to a power distribution assembly with modular arrangements.

BACKGROUND

Electrical power systems, such as those found in an aircraft power distribution system, employ power generating systems or power sources, such as generators, for generating electricity for powering electrical loads, such as loads in the systems and subsystems of an aircraft. As the electricity traverses electrical bus bars to deliver power from power sources to electrical loads, power distribution nodes dispersed throughout the power system ensure that power delivered to the electrical loads meets the designed power criteria for the loads. Power distribution nodes can, for instance, further provide step-up or step-down power conversion, direct current (DC) to alternating current (AC) power conversion or AC to DC power conversion, or switching operations to selectively enable or disable the delivery of power to particular electrical loads, depending on, for example, available power distribution supply, criticality of electrical load functionality, or aircraft mode of operation, such as take-off, cruise, or ground operations.

BRIEF DESCRIPTION

In one aspect, the disclosure relates to a modular power distribution assembly. The modular power distribution assembly includes a frame defined by a first set of parallel supports and a second set of parallel supports, the second set of parallel supports connecting the first set of parallel supports, the frame defining a generally planar assembly defining a first side and a second side opposite the first side, a first set of components extending from the first side of the frame and operably coupled to the frame, the first set of components including a set of primary power modules, each of the set of primary power modules having a power input, a bus bar power output, and a first communication interface, a set of secondary power modules, each of the set of secondary power modules having a bus bar power input, a load output, and a second communication interface, and a control module having a third communication interface, and a second set of components extending from the second side of the frame and operably coupled to at least one of the frame or the first set of components, the second set of components including a common communication backplane having backplane interfaces matching a total number of first, second, and third communication interfaces defined by the first set of components, with the common communication backplane configured to communicate instructions from the control module to the set of primary power modules and the set of secondary power modules, and a bus bar electrically connecting at least one bus bar power outputs to at least one bus bar power input.

In another aspect, the disclosure relates to a method of assembling a modular power distribution assembly. The method includes coupling a first set of components to a first side of a frame defined by at least one set of parallel supports, the first set of components including a set of primary power modules each having a power input, a bus bar power output, and a first communication interface, and also including a set of secondary power modules each having a bus bar power input, a load output, and a second communication interface, coupling a second set of components to a second side of the frame, the second set of components including a common communication backplane configured to communicate instructions to the set of primary power modules and the set of secondary power modules, and also including a bus bar electrically connecting at least one bus bar power output to at least one bus bar power input, coupling at least one power input of the first set of components to the bus bar, and coupling at least one of the first communication interface or the second communication interface of the first set of components to the common communications backplane.

DETAILED DESCRIPTION

Figure 1:
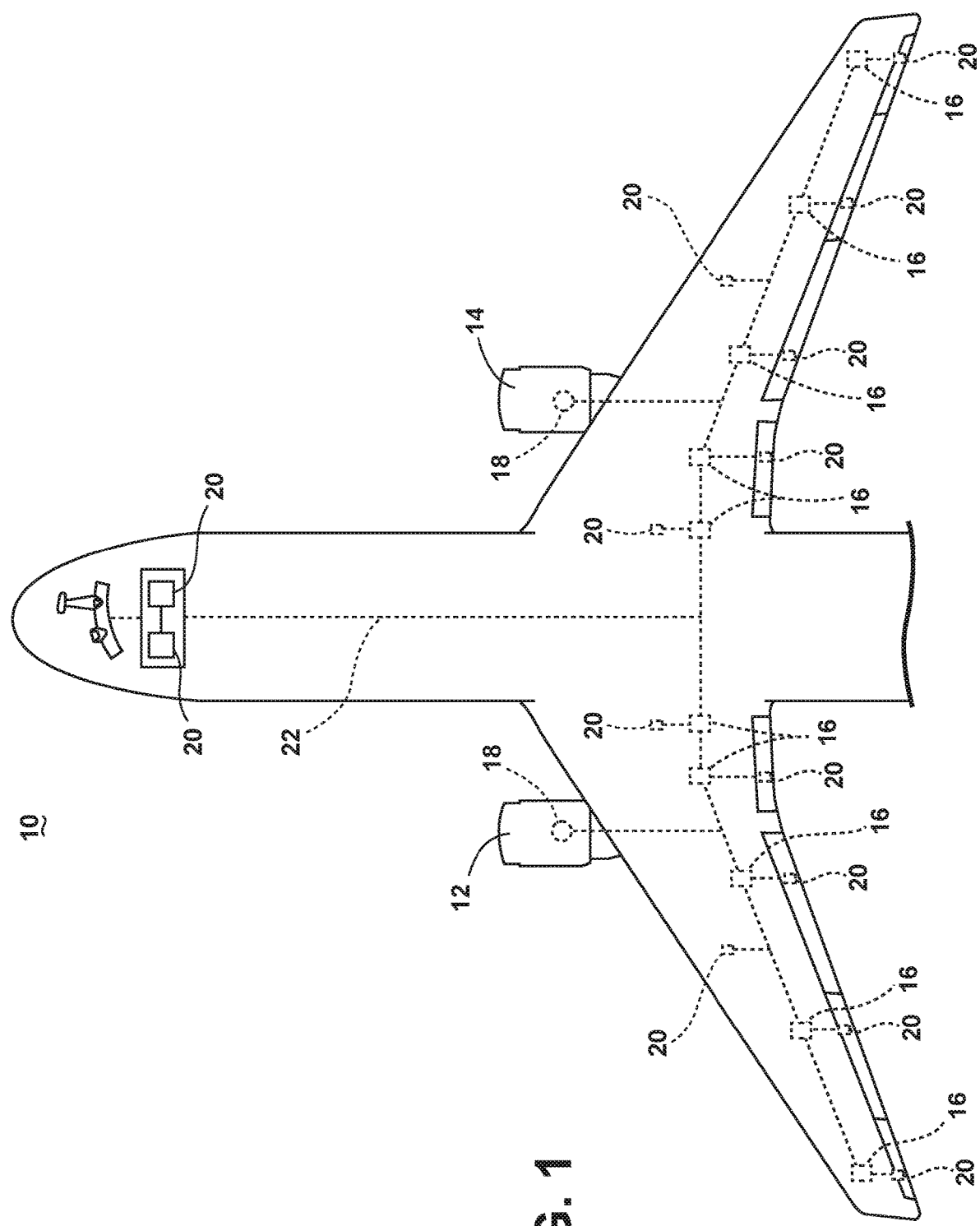
FIG. 1 is a top down schematic view of an aircraft having a power distribution system in accordance with various aspects described herein.

The described aspects of the present disclosure are directed to a method and apparatus associated with a modular power distribution assembly or apparatus. Typical power distribution systems can include one or more rack assemblies for including, for example, a number of electronic cards to provide for the aforementioned conversions or switching functions. The rack assemblies are not typically optimized to be contained within the smallest configurable installation volume, leading to rack assemblies larger than necessary, and unused or underutilized components. Furthermore, electronic components mounted in traditional rack assemblies are generally not serviceable without disassembling the entire rack assembly. Traditional interlinking module designs generally do not allow for individual modules to be removed without removing an entire subassembly. Furthermore, traditional internal bus bar arrangements can place restrictions on system interlinking, e.g. particular modules or units must be positioned side-by-side for coupling via the bus bar.

Aspects of the present disclosure provide for a modular power distribution assembly that can be built up or scalable based on power demand, wherein a number of power modules is selected based on power demand and a backplane can be similarly scaled to match the number of power modules. Aspects of the disclosure also provide for selective removal of a power module from the assembly without disrupting a power or signal connection between the backplane and other power modules within the assembly. That is, bus bars can bypass units that do not require a power or signal feed, or bypass a location where a unit has been removed from the assembly while still providing a power or signal feed to other modules in the assembly.

One example environment where such a method and apparatus can be used includes, but is not limited to, a power distribution system for an aircraft. While this description is primarily directed toward a power distribution system for an aircraft, it is also applicable to any environment using a power distribution system where input power is received, acted upon (if necessary), e.g., converted or modified, and distributed to one or more electrical loads. It will be understood that while one aspect of the disclosure is shown in an aircraft environment, the disclosure is not so limited and has general application to electrical power systems in non-aircraft applications, such as other mobile applications and non-mobile industrial, commercial, and residential applications.

While "a set of" various elements will be described, it will be understood that "a set" can include any number of the respective elements, including only one element. The use of the terms "proximal" or "proximate" to an element refers to a component being relatively closer to the element as compared to another component. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements. Non-limiting example power distribution bus connections or disconnections can be enabled or operated by way of switching, bus tie logic, or any other connectors configured to enable or disable the energizing of electrical loads downstream of the bus. The exemplary drawings are for purposes of illustration only and the dimensions, positions, order and relative sizes reflected in the drawings attached hereto can vary.

Additionally, as used herein, a "controller" or "controller module" can include a component configured or adapted to provide instruction, control, operation, or any form of communication for operable components to effect the operation thereof. A controller module can include any known processor, microcontroller, or logic device, including, but not limited to: field programmable gate arrays (FPGA), an application specific integrated circuit (ASIC), a full authority digital engine control (FADEC), a proportional controller (P), a proportional integral controller (PI), a proportional derivative controller (PD), a proportional integral derivative controller (PID controller), a hardware-accelerated logic controller (e.g. for encoding, decoding, transcoding, etc.), the like, or a combination thereof. Non-limiting examples of a controller module can be configured or adapted to run, operate, or otherwise execute program code to effect operational or functional outcomes, including carrying out various methods, functionality, processing tasks, calculations, comparisons, sensing or measuring of values, or the like, to enable or achieve the technical operations or operations described herein. The operation or functional outcomes can be based on one or more inputs, stored data values, sensed or measured values, true or false indications, or the like. While "program code" is described, non-limiting examples of operable or executable instruction sets can include routines, programs, objects, components, data structures, algorithms, etc., that have the technical effect of performing particular tasks or implement particular abstract data types. In another non-limiting example, a controller module can also include a data storage component accessible by the processor, including memory, whether transient, volatile or non-transient, or non-volatile memory. Additional non-limiting examples of the memory can include Random Access Memory (RAM), Read-Only Memory (ROM), flash memory, or one or more different types of portable electronic memory, such as discs, DVDs, CD-ROMs, flash drives, universal serial bus (USB) drives, the like, or any suitable combination of these types of memory. In one example, the program code can be stored within the memory in a machine-readable format accessible by the processor. Additionally, the memory can store various data, data types, sensed or measured data values, inputs, generated or processed data, or the like, accessible by the processor in providing instruction, control, or operation to effect a functional or operable outcome, as described herein.

Additionally, as used herein, elements being "electrically connected," "electrically coupled," or "in signal communication" can include an electric transmission or signal being sent, received, or communicated to or from such connected or coupled elements. Furthermore, such electrical connections or couplings can include a wired or wireless connection, or a combination thereof.

Also, as used herein, while sensors can be described as "sensing" or "measuring" a respective value, sensing or measuring can include determining a value indicative of or related to the respective value, rather than directly sensing or measuring the value itself. The sensed or measured values can further be provided to additional components. For instance, the value can be provided to a controller module or processor as defined above, and the controller module or processor can perform processing on the value to determine a representative value or an electrical characteristic representative of said value.

As illustrated in FIG. 1, an aircraft 10 is shown having at least one gas turbine engine, shown as a left engine system 12 and a right engine system 14. Alternatively, the power system can have fewer or additional engine systems. The left and right engine systems 12, 14 can be substantially identical, and can further include at least one power source, such as an electric machine or a generator 18. The aircraft is shown further having a set of power-consuming components, or electrical loads 20, such as for instance, an actuator load, flight critical loads, and non-flight critical loads. The electrical loads 20 are electrically coupled with at least one of the generators 18 via a power distribution system including, for instance, power transmission lines 22 or bus bars, and power distribution nodes 16. It will be understood that the illustrated aspect of the disclosure of FIG. 1 is only one non-limiting example of a power distribution system, and many other possible aspects and configurations in addition to that shown are contemplated by the present disclosure. Furthermore, the number of, and placement of, the various components depicted in FIG. 1 are also non-limiting examples of aspects associated with the disclosure.

In the aircraft 10, the operating left and right engine systems 12, 14 provide mechanical energy which can be extracted, typically via a spool, to provide a driving force for the generator 18. The generator 18, in turn, generates power, such as AC or DC power, and provides the generated power to the transmission lines 22, which delivers the power to the power distribution nodes 16, positioned throughout the aircraft 10. The power distribution nodes 16 receive the AC or DC power via the transmission lines 22, and can provide switching, power conversion, or distribution management functions, as needed, in order to provide the desired electrical power to the electrical loads 20 for load operations.

Example power distribution management functions can include, but are not limited to, selectively enabling or disabling the delivery of power to particular electrical loads 20, depending on, for example, available power distribution supply, criticality of electrical load 20 functionality, or aircraft mode of operation, such as take-off, cruise, or ground operations. The power distribution nodes 16 are shown selectively coupled with a single electrical load 20 for ease of illustration and understanding. Aspects of the disclosure can include power distribution nodes 16 that are selectively coupled with a set of electrical loads 20, wherein a power distribution node 16 can selectively enable or disable the delivery of power to individual or a subset of the electrical loads 20, as described herein. Additionally, all or a subset of the power distribution nodes 16 can be further interconnected (not shown) in order to provide redundant power supply in the event of malfunction or failure of a single node 16.

Additional management functions can be included. Furthermore, additional power sources for providing power to the electrical loads 20, such as emergency power sources, ram air turbine systems, starter/generators, or batteries, can be included, and can substitute for the power source.

Figure 2:
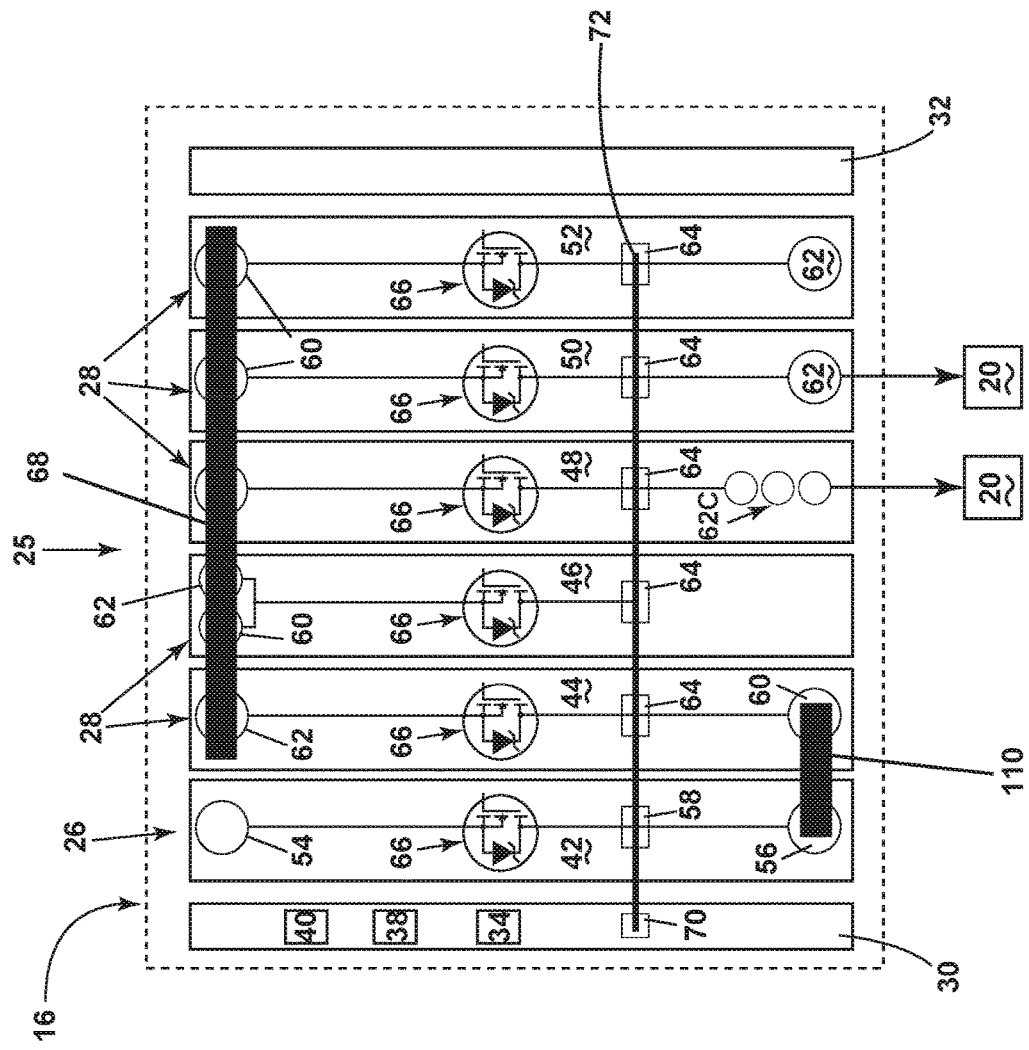
FIG. 2 is a schematic view of a modular power distribution assembly that can be utilized in the power distribution system of FIG. 1, in accordance with various aspects described herein.

FIG. 2 schematically illustrates one exemplary power distribution node 16 that can be utilized in the aircraft of FIG. 1. As shown, the power distribution node 16 can include a modular power distribution assembly 25 having a set of primary power modules 26 connected to a set of secondary power modules 28. As used herein, a "modular" component or "modularity" of a component will refer to the aspect or characteristic of employing or utilizing discrete modules, parts, or numbers of parts as a basis of construction or forming of that component. Such discrete modules can be selectable, customizable, chosen, optioned, built, or determined to form such a modular component.

A common control module 30 can be included in the power distribution node 16 and electrically coupled to the set of primary power modules 26. The common control module can include a set of subcomponents or subsystems including, but not limited to a communication interface controller 34, a processor 38, and memory 40. An opposing end module 32, which can include an end plate or physical cover, can also be provided and electrically coupled to the set of secondary power modules 28. The set of primary power modules 26, the set of secondary power modules 28, and the common control module 30 together can collectively form a first set of components 41 within the modular power distribution assembly 25.

In the example shown, the set of primary power modules 26 is illustrated with a single primary power module 42, and the set of secondary power modules 28 is illustrated with five secondary power modules. More specifically, the set of secondary power modules 28 can include a first power module 44, a second power module 46, a third power module 48, a fourth power module 50, and a fifth power module 52. It will be understood that any number of primary power modules or secondary power modules can be provided. Aspects of the disclosure can include that each in the set of primary power modules 26 or each in the set of secondary power modules 28 are substantially alike. For example, they can be of similar construction and composition. Alternatively, the set of primary power modules 26 or the set of secondary power modules 28 can include at least two subsets of similar constructions and compositions. Such similarity can enable faster, easier, or more efficient maintenance operations of the modular power distribution apparatus 25. For example, such similarity can provide for replacement of one power module with another power module without need of disassembling the modular power distribution assembly 25.

The individual power modules 44, 46, 48, 50, 52 are shown in a common physical alignment. For example, the longitudinal direction of the set of secondary power modules 28 can be parallel to adjacent ones of the set of secondary power modules 28. Additionally or alternatively the set of secondary power modules 28 can be arranged serially or in series. Aspects of the disclosure can further be included wherein the power modules are configured in alternative geometric shapes beyond square-like configurations (e.g. circular, triangular, trapezoidal, etc.).

A first or primary communication interface 58 can be included in each primary power module in the set of primary power modules 26. At least one electrical power interface, illustrated herein in the form of a power input 54 and a bus bar power output 56 are also included in each primary power module in the set of primary power modules 26. In the example shown, the single primary power module 42 is illustrated with a one primary communication interface 58, one power input 54, and one bus bar output 56; however, it will be understood that any number of primary communication interfaces, power inputs, and bus bar power outputs can be provided.

A second or secondary communication interface 64 can be included on each secondary power module of the set of secondary power modules 28. At least one electrical power interface in the form of a bus bar power input 60 and a load output 62 can also be included on each secondary power module of the set of secondary power modules 28. It will be understood that any number of secondary communication interfaces, bus bar power inputs, and load outputs can be provided.

Furthermore, any or all of the power modules in the set of primary power modules 26 and the set of secondary power modules 28 can include at least one switching element 66. In this manner, either or both of the set of primary power modules 26 and the set of secondary power modules 28 can be switchable. Aspects of the switching element 66 can include an electrical switch, such as a solid state power controller, a solid state switch, or a transistor, such as a silicon carbide (SiC) or Gallium Nitride (GaN) based, high bandwidth power switch. SiC or GaN can be selected based on their solid state material construction, their ability to handle large power levels in smaller and lighter form factors, and their high speed switching ability to perform electrical operations very quickly. Additional non-limiting examples of the switching element 66 can include non-polar switching elements 66. Yet additional non-limiting examples of the solid state switch can comprise silicon-based power switches, also capable of high speed switching.

At least one conductor can be provided in the modular power distribution assembly 25 for enabling an electrical connection between components secured therein. More specifically, conductors in the form of a bus bar 68 and a power input bus bar 110 can be provided. The bus bar 68 and power input bus bar 110 can be selected to enable, for instance, an electrical connection between any or all of the power input 54, bus bar power output(s) 56, bus bar power input(s) 60, or load output(s) 62.

The example of FIG. 2 illustrates one example of such an electrical connection enabled by the bus bar 68 and power input bus bar 110. In this example, the power input 54 of the primary module 42 is connectable to a power source (not shown). The power input bus bar 110 electrically connects the bus bar power output 56 of the primary module 42 to the bus bar power input 60 of the first power module 44. In this manner, the power input bus bar 110 provides an electrical power connection between the set of primary power modules 26 and the set of secondary power modules 28.

The bus bar 68 electrically connects the power modules 44, 46, 48, 50, 52. Furthermore, the bus bar 68 is schematically illustrated as covering a portion of each bus bar power input 60 and bus bar power output 56 for visual clarity, and it will be understood that the sizes of the bus bar 68, bus bar power input 60, and bus bar power output 56 can be any suitable size. It should be understood that while the bus bar 68 is schematically illustrated in a rectangular form extending linearly across the sets of primary and secondary power modules 26, 28, such illustration is for the purposes of visual clarity only. The bus bar 68 can extend in any suitable direction and need not have a linear form.

When connected, power is supplied to the power input 54, then to the power input bus bar 110 from the set of primary power modules 26 to the set of secondary power modules 28, then to the bus bar 68 connecting the load output 62 of the first power module 44 to the bus bar power inputs 60 of the second, third, fourth, and fifth power modules 46, 48, 50, 52, and out to selected loads 20 via the load outputs 62.

In the example shown, the first set of components 41 can include a power converter. More specifically, the third power module 48 is illustrated as having a bus bar power input 56 and a converted power output 62C. In a non-limiting example, the converted power output 62C can be in the form of a 3-phase AC load output from a DC input power from the bus bar power input 56. In another example, the second power module 46 is illustrated as having its bus bar power input 60 located adjacent its load output 62. Such an arrangement can provide for a power pass-through in one example, or for a communications controller within the second power module 46 in another example.

It is contemplated that the primary communication interface 58 and secondary communication interfaces 64 can be electrically coupled to the switching elements 66. The communication interfaces 58, 64 can include any suitable interface for transmitting a signal, control signal, data, or the like, including a wired or wireless electrical connection, and can controllably operate the switching elements 66. Furthermore, the common control module 30 can include a third or controller communication interface 70 electrically coupled to any or all primary communication interfaces 58 and the secondary communication interfaces 64.

A common communication backplane 72 can be provided in the modular power distribution assembly 25. The common communication backplane 72 can be configured to communicate instructions from the common control module 30 to the set of primary power modules 26 and the set of secondary power modules 28, such as via the primary communication interface(s) 58, the secondary communication interface(s) 64, or the controller communication interface 70. Such instructions can include transmission and receiving of control signals, data packets, data messages, operable instructions, and the like. The common communication backplane 72, bus bar 68, and power input bus bar 110 together can collectively form a second set of components 74 within the modular power distribution assembly 25.

The switching elements 66 can therefore be communicatively coupled with the communication interface controller 34 of the common control module 30 via the controller communication interface 70. It will be understood that the common control module 30 can be coupled to all switching elements 66 in the modular power distribution assembly 25 or any subset thereof.

At least a subset of the load outputs 62 can be individually electrically coupled with at least one electrical load 20. For example, the second and third power modules 44, 48 are each shown having an electrical load 20 coupled with the corresponding switching element 66 via a corresponding load output 62. It is further contemplated in a non-limiting example that multiple load outputs 62 or multiple switching elements 66 can be provided in a single power module. Additionally or alternatively, a set of electrical loads 20 can be electrically coupled to a single load output 62. Stated another way, a single power module in the set of primary power modules 26 or in the set of secondary power modules 28 can include a set of electrically coupled electrical loads 20 and set of load outputs 62. In still another non-limiting example, a switching element 66 can be provided corresponding to each load output 62.

Aspects of the set of primary power modules 26 and the set of secondary power modules 28 can optionally include additional components configured, for example, to provide or enable power conversion operations (e.g. AC to DC conversion, DC to AC conversion, a first DC power to a second DC power, or the like), or to selectively enable or disable the delivery of power to one or more particular electrical loads 20, depending on, for example, available power distribution supply, criticality of electrical load functionality, or aircraft mode of operation, such as take-off, cruise, or ground operations.

Figure 3:
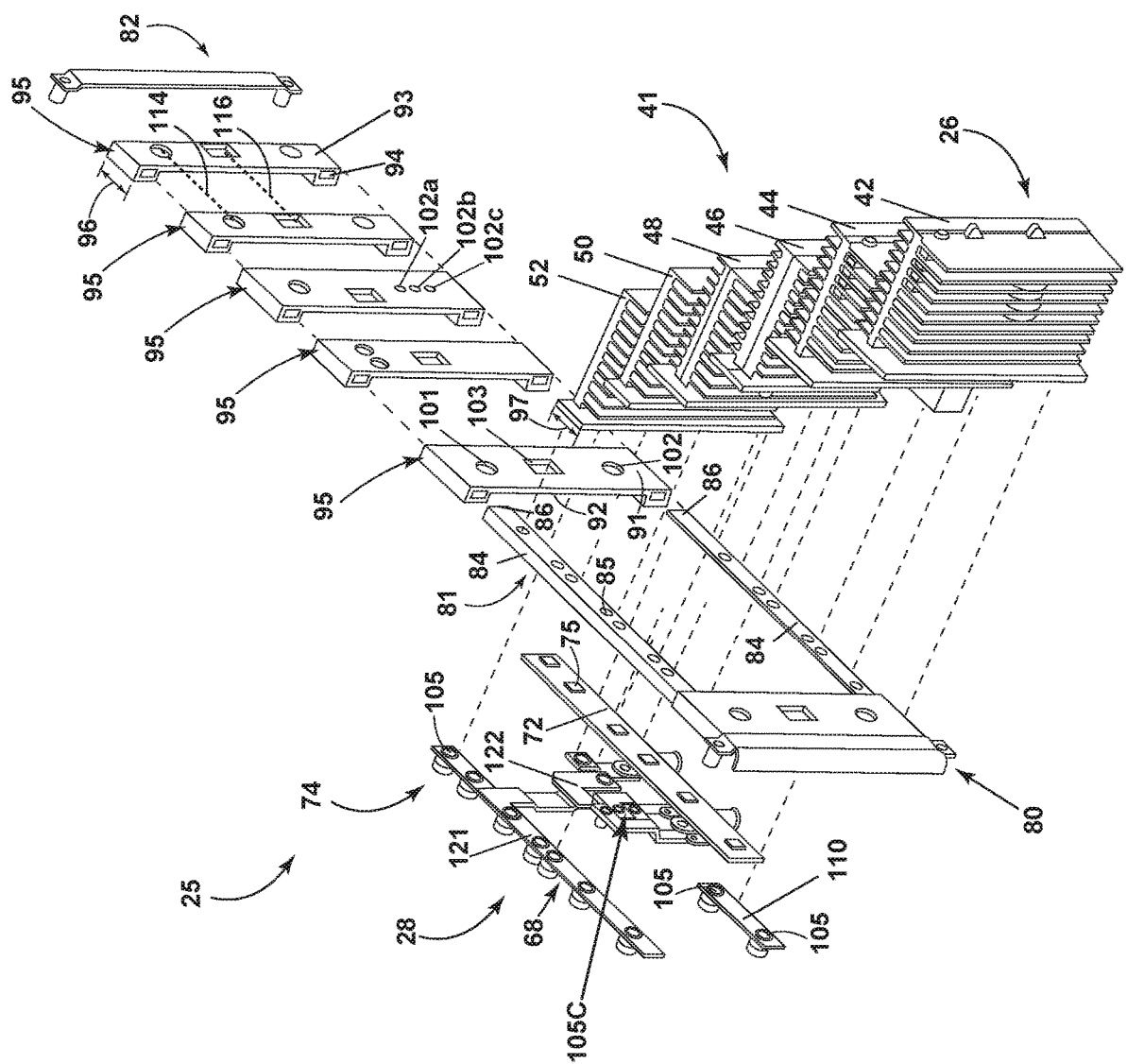
FIG. 3 is an exploded isometric view of the power distribution assembly of FIG. 2 in accordance with various aspects described herein.

Referring now to FIG. 3, the modular power distribution assembly 25 is illustrated in exploded form to illustrate a portion of the interconnection between the common control module 30, the set of primary power modules 26, and the set of secondary power modules 28. For the purposes of visual clarity, the common control module 30 and end module 32 of FIG. 2 are not illustrated.

A frame 80 is included in the modular power distribution assembly 25. The frame 80 is defined by a first set of parallel supports 81 and a second set of parallel supports 82 connecting the first set of parallel supports 81. In the example shown, the first set of parallel supports 81 defines opposing distal ends 86 and each of the second set of parallel supports 82 couples a corresponding one of the opposing distal ends 86. It is also contemplated that the second set of parallel supports 82 can be configured to mount with a rack assembly (not shown). For example, mounting brackets can be provided on either or both the first set of parallel supports 81 and second set of parallel supports 82 for rack mounting. In such a case, a rack assembly can include any suitable number of modular power distribution assemblies 25 including multiples thereof.

The frame 80 can define a generally planar assembly having a first side 91 and a second side 92. At least two support structures 84 can be provided in each of the first set of parallel supports 81 and second sets of parallel supports 82. The support structures 84 can include apertures 85 through which an electrical connection can be made for either or both of the set of primary power modules 26 or the set of secondary power modules 28.

At least one carrier plate 95 can be provided in the modular power distribution assembly 25. In the example shown, six carrier plates 95 are provided, each of the carrier plates 95 corresponding to one of the total number of power modules in the set of primary power modules 26 (e.g., one) and in the set of secondary power modules 28 (e.g., five). The carrier plates 95 can be operably coupled or mounted to the first set of parallel supports 81. In the example shown, the carrier plates 95 include a body 93 with hollow portions 94 provided on each end of the body 93. The hollow portions 94 can slidably mount to the first set of parallel supports 81, though this need not be the case. Any suitable mounting, securing, or fastening mechanism is contemplated for use.

The first set of components 41 can be operably coupled to the frame 80. The second set of components 74 can be operably coupled to at least one of the frame 80 or the first set of components 41. In the illustrated example, the body 93 of the carrier plates 95 defines the first side 91 and the second side 92 of the frame 80. It is further contemplated that the support structures 86 themselves can define the first side 91 and the second side 92. In such a case, the first set of components 41 can be coupled directly to the support structures 86, and the second set of components 74 can be coupled directly to at least one of the support structures 86 or the first set of components 41, without including the carrier plates 95.

The first set of components 41 can extend from the first side 91 of the frame 80 when assembled. The second set of components 74 can extend from the second side 92 of the frame 80 when assembled. In this manner, the first set of components 41 can be mounted or coupled to at least one of the carrier plates 95, the first set of parallel supports 81, or the second set of components 74. The second set of components 74 can be mounted to at least one of the carrier plates 95, the first set of parallel supports 81, or the first set of components 41.

At least one aperture can be defined in each of the carrier plates 95. The at least one aperture can extend through the body 93 from the first side 91 to the second side 92. It is contemplated that a set of apertures can be included including at least one aperture for a power connection and at least one aperture for a communication interface. In the illustrated example, a first aperture 101 adapted for a first power connection, a second aperture 102 adapted for a second power connection, and a third aperture 103 adapted for the common communication backplane 72 are included in the body of the carrier plate 95. For visual clarity, the first and second apertures 101, 102 are illustrated as having a circular geometric profile while the third aperture 103 is illustrated as having a square or rectangular geometric profile; however, it will be understood that any suitable geometric profile can be utilized.

The body of each carrier plate 95 can define a plate width 96 as shown. It is contemplated that the plate width 96 can be selected to match a width of one component in the first set of components 41. In the illustrated example, an exemplary module width 97 is shown for the fifth power module 52, and the plate width 96 can match the module width 97. The module width 97 or plate width 96 can be any suitable size, such as 20 cm in a non-limiting example. Furthermore, the module width 97 can vary in the first set of components 41. In the example shown, the module width 97 of the fifth power module 52 is smaller than that of the first power module 44. The plate width 96 of the corresponding carrier plate 95 can be sized to match the module width 97 of the power modules 44, 52 connected thereto.

In addition, load output connectors 105 can be included in the bus bar 68. The load output connectors 105 can be configured to electrically connect each one of the set of secondary power modules 28 with a respective electrical load 20 (FIG. 2). The load output connectors 105 can confront or fully extend through the first aperture 101 and second aperture 102 for connection with the bus bar power output(s) 56 and bus bar power input(s) 60 (FIG. 2). For example, the load output connectors 105 can have the same geometric profile as the first and second apertures 101, 102, and are illustrated as being round in the example of FIG. 3.

In another example, the load output connectors 105 can include hardware fittings, such as bayonet fittings for pins.

Furthermore, in the example shown, the bus bar 68 also has a modular form. A first portion 121 of the bus bar 68 extends in a first direction, such as a direction parallel to the support structures 84. A second portion 122 of the bus bar 68 extends in a second direction different from the first direction, such as perpendicular to the support structures 84. The bus bar 68 can include multiple portions extending in multiple directions based on power or size requirements.

The bus bar 68 can include a three-phase power connection or converted load output connector 105C for connection with the converted load output 62C of the third power module 48. That is, the converted load output 62C can connect to the three-phase converted load output connector 105C via second apertures 102a, 102b, 102c in the corresponding carrier plate 95 as shown.

The common communication backplane 72 can include backplane interfaces 75 configured to provide signal communication between the set of primary power modules 26, the set of secondary power modules 28, and the common control module 30 (FIG. 2). In one example, the backplane interfaces 75 can provide for controllable operation of the switching elements 66 (FIG. 2) by the common control module 30. The backplane interfaces 75 can be configured to at least confront, or fully extend through, corresponding third apertures 103 of the carrier plates 95 for coupling to the set of primary power modules 26 or the set of secondary power modules 28. The backplane interfaces 75 can have the same geometric profile as the third aperture 103, e.g. square or rectangular, though this need not be the case. While illustrated as a straight or linear bar, it is further contemplated that the common communication backplane 72 can also have a modular form, such as a first portion extending in a first direction and a second portion extending in a second direction.

When assembled, apertures of the carrier plates 95 can form linear row arrangements that are parallel with the first set of parallel supports 81. For example, a first linear row arrangement 114 of at least one of the first aperture 101 or the second aperture 102 of each carrier plate 95 can be defined in the modular power distribution assembly 25. A second linear row arrangement 116 of the third apertures 103 of each carrier plate 95 can also be defined, with the second linear row arrangement 116 also being parallel to the first set of parallel supports 81.

It can be appreciated that a number of the set of primary power modules 26, a number of the set of secondary power modules 28, a number of backplane interfaces 75, and the configuration of bus bar 68 itself can be selectable, customizable, chosen, optioned, built, or determined based on power distribution demand. For example, the bus bar 68 can be selected or customized to match a total number of first apertures 101 or a total number of second apertures 102 defining the first linear row arrangement 114. Such selection or customization can include, in one example, selecting a bus bar 68 based on length wherein a longer bus bar 68 can provide for an increased number of power connections for a set of primary power modules 26 or a set of secondary power modules 28.

It is contemplated that power modules in either or both of the set of primary power modules 26 or the set of secondary power modules 28 can be selectively removable from the modular power distribution assembly 25 without interruption of signal or power to remaining power modules connected thereto. In one example, the second power module 46 can be removed from a corresponding carrier plate 95, and the bus bar 68 can still provide power to the first power module 44 and third power module 48. It is contemplated that the bus bar 68 can be configured to selectively couple to, or decouple from, a given power module while still providing power to other power modules connected thereto. The load output connectors 105, 105C can, for example, remain conductive or provide a conductive path through the bus bar 68 even when no power module is connected. Additionally or alternatively, the load output connectors 105, 105C can have a smaller geometric size compared to a width of the bus bar 68 such that a conductive path is still formed around a disconnected load output connector 105, 105C. The common communications backplane 72 can remain also conductive or provide a conductive or signal path to, for example, the first and third power modules 44, 48 when the second power module 46 is removed. In this manner, the modular power distribution assembly 25 can provide for a modular backplane in which power modules can be selectively added or removed without interruption or disruption of operations of other power modules in the assembly.

It is also contemplated that the common communications module 30 can selectively provide power or control signals to any or all power modules in the modular power distribution assembly 25. For example, power or control signals can be provided to a subset, less than the entirety, of the set of secondary power modules 28.

Figure 4:
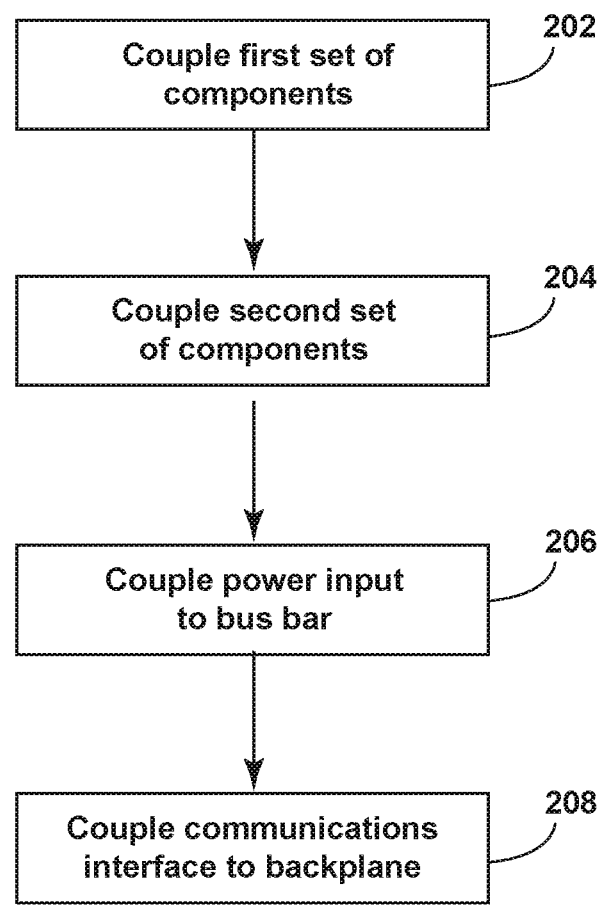
FIG. 4 is a flowchart illustrating a method of assembling the power distribution assembly of FIG. 3 in accordance with various aspects described herein.

Referring now to FIG. 4, a method 200 of assembling the modular power distribution assembly 25 is shown. At 202, the method 200 includes coupling the first set of components 41 to the first side 91 of the frame 80, with the frame 80 defined by at least one set of parallel supports, such as the first set of parallel supports 81 or the second set of parallel supports 82. The first side 91 of the frame 80 can be defined by the carrier plate 95 or the support structure 84 as described above. The first set of components 41 includes the set of primary power modules 26 each having the power input 54, bus bar power output 56, and primary communication interface 58. At 204, the method 200 includes coupling the second set of components 74 to the second side 92 of the frame 80, including the carrier plate 95 or the support structure 84. The second set of components 74 includes the common communication backplane 72 configured to communicate instructions to the set of primary power modules 26 and the set of secondary power modules 28. The second set of components 74 also includes the bus bar 68 electrically connecting at least one bus bar power output 56 to at least one bus bar power input 60. Optionally, the method 200 includes mounting at least one carrier plate 95 onto the at least one set of parallel supports, such as the first set of parallel supports 81. Optionally, the method 200 includes coupling the first set of components 41 and the second set of components 74 to the at least one carrier plate 95. The at least one carrier plate 95 can form a portion of the frame 80, or be separate therefrom. Optionally, the method 200 includes coupling at least one power input 54 of the first set of components to the bus bar 68 via a corresponding aperture 101, 102 in the carrier plate 95. Optionally, the method 200 includes coupling at least one communication interface 58, 64, 70 of the first set of components 41 to the common communication backplane 72 via a corresponding aperture 103 in the carrier plate 95.

The sequence depicted is for illustrative purposes only and is not meant to limit the method 200 in any way as it is understood that the portions of the method can proceed in a different logical order, additional or intervening portions can be included, or described portions of the method can be divided into multiple portions, or described portions of the method can be omitted without detracting from the described method. For example, the connecting of the at least one switching module to at least one other switching module at 104 can further includes selecting an order for disposition of the switching modules or solid state power controllers.

Aspects of the disclosure provide for a modular power distribution assembly and corresponding modular backplane formed of the bus bar, communications backplane, frame, and carrier plates as described herein. The modular power distribution assembly provides for removal of individual power modules from the assembly without interrupting power or signal connection for the remaining power modules, as well as the ability to "skip over" power modules or selectively provide power or control signals to a subset of power modules connected in the power distribution assembly. Aspects disclosed herein also provide for a modular and scalable power distribution and conversion apparatus, including being scalable in two dimensions to fit space requirements while meeting power demands. The technical effect of the above-described aspects is that a modular power distribution assembly can be designed or built up, as needed or on-demand, to operate power switching functions to electrical loads, or power converting and further switching functions, as described herein. One advantage that can be realized in the above aspects is that the tailoring to the particularized power distribution needs can reduce the number of unnecessary components included in the power distribution assembly. Furthermore, the power distribution assembly itself can be selected to only provide a limited number of power outputs, including dissimilar power output characteristics (e.g. via a power converter) tailored to the expected number of electrical loads required based on power demands.

Aspects of the disclosure also enable an optimized component size and power conversion operations, thereby providing for superior weight and size advantages over conventional power distribution systems.

Another advantage to the above-described aspects is that a reduction in number of unnecessary components can reduce the cost for the power distribution assembly. Such a decreased number of parts as the system can make the distribution system or power distribution assembly inherently more reliable.

Yet additional advantages can include minimized wire weight due to proximity of the power distribution node to the electrical loads, greater flexibility in design and utilization of power electronics, modular construction, and reusable modules resulting in reduced engineering, development, testing, and validation efforts and costs.

When designing aircraft components, important factors to address are size, weight, and reliability. The above described power distribution apparatus results in a lower weight, smaller sized, increased performance, and increased reliability system. The lower number of parts and reduced maintenance will lead to a lower product costs and lower operating costs. Reduced weight and size correlate to competitive advantages during flight.

To the extent not already described, the different features and structures of the various aspects may be used in combination with each other as desired. That one feature may not be illustrated in all of the aspects is not meant to be construed that it may not be, but is done for brevity of description. Thus, the various features of the different aspects may be mixed and matched as desired to form new aspects, whether or not the new aspects are expressly described. All combinations or permutations of features described herein are covered by this disclosure.

This written description uses examples to disclose aspects of the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Further aspects of the invention are provided by the subject matter of the following clauses:

A modular power distribution assembly, comprising a frame defined by a first set of parallel supports and a second set of parallel supports, the second set of parallel supports connecting the first set of parallel supports, the frame defining a generally planar assembly defining a first side and a second side opposite the first side, a first set of components extending from the first side of the frame and operably coupled to the frame, the first set of components comprising a set of primary power modules, each of the set of primary power modules having a power input, a bus bar power output, and a first communication interface, a set of secondary power modules, each of the set of secondary power modules having a bus bar power input, a load output, and a second communication interface, and a control module having a third communication interface; and a second set of components extending from the second side of the frame and operably coupled to at least one of the frame or the first set of components, the second set of components comprising a common communication backplane having backplane interfaces matching a total number of first, second, and third communication interfaces defined by the first set of components, with the common communication backplane configured to communicate instructions from the control module to the set of primary power modules and the set of secondary power modules, and a bus bar electrically connecting at least one bus bar power outputs to at least one bus bar power input.

The modular power distribution assembly of any preceding clause wherein a number in the set of primary power modules, a number in the set of secondary power modules, a number of backplane interfaces, and the bus bar are selectable based on power distribution demand.

The modular power distribution assembly of any preceding clause further comprising a carrier plate carried by the first set of parallel supports.

The modular power distribution assembly of any preceding clause wherein the second set of components is mounted to at least one of the carrier plate, the frame, or the first set of components.

The modular power distribution assembly of any preceding clause wherein the first set of components is mounted to at least one of the carrier plate, the frame, or the second set of components.

The modular power distribution assembly of any preceding clause wherein the carrier plate comprises a plate width matching a width of one of the first set of components.

The modular power distribution assembly of any preceding clause wherein the carrier plate defines at least a first aperture for a first power connection, a second aperture for a second power connection, and a third aperture for the common communication backplane.

The modular power distribution assembly of any preceding clause, further comprising a first linear row arrangement of at least one of the first aperture or second aperture of each carrier plate and being parallel with the first set of parallel supports, and also comprising a second linear row arrangement of the third apertures of each carrier plate and being parallel with the first set of parallel supports.

The modular power distribution assembly of any preceding clause wherein the bus bar is selected to match a number of first apertures or a number of second apertures defining the first linear row arrangement.

The modular power distribution assembly of any preceding clause wherein the communications backplane is selected to match the number of third apertures of the second linear row arrangement.

The modular power distribution assembly of any preceding clause wherein the second set of parallel supports is configured to mount with a rack assembly.

The modular power distribution assembly of any preceding clause wherein the first set of components includes a power converter having a bus bar power input and a converted power output.

The modular power distribution assembly of any preceding clause wherein the second set of components further includes a power input bus bar selected to match the number of the set of primary power modules, with the power input bus bar electrically connecting each of the power inputs of the set of primary power modules and also connectable with a power source.

The modular power distribution assembly of any preceding clause wherein the second set of components further includes a respective load output connector for each of the secondary power modules, configured to electrically connect each one of the set of secondary power modules with a respective electrical load.

The modular power distribution assembly of any preceding clause wherein the first set of parallel supports defines opposing distal ends, wherein each of the second set of parallel supports couples a corresponding one of the opposing distal ends.

A method of assembling a modular power distribution assembly, the method comprising coupling a first set of components to a first side of a frame defined by at least one set of parallel supports, the first set of components including a set of primary power modules each having a power input, a bus bar power output, and a first communication interface, and also including a set of secondary power modules each having a bus bar power input, a load output, and a second communication interface, coupling a second set of components to a second side of the frame, the second set of components including a common communication backplane configured to communicate instructions to the set of primary power modules and the set of secondary power modules, and also including a bus bar electrically connecting at least one bus bar power output to at least one bus bar power input, coupling at least one power input of the first set of components to the bus bar, and coupling at least one of the first communication interface or the second communication interface of the first set of components to the common communications backplane.

The method of any preceding clause, further comprising mounting at least one carrier plate onto the at least one set of parallel supports.

The method of any preceding clause, further comprising coupling the first set of components and the second set of components to the at least one carrier plate.

The method of any preceding clause, further comprising coupling at least one power input of the first set of components to the bus bar via a corresponding aperture in the carrier plate.

The method of any preceding clause, further comprising coupling at least one communication interface of the first set of components to the common communication backplane via a second corresponding aperture in the carrier plate.

What is claimed is:

1. A modular power distribution assembly, comprising:
   a frame defined by a first set of parallel supports and a second set of parallel supports, the second set of parallel supports connecting the first set of parallel supports, the frame defining a generally planar assembly defining a first side and a second side opposite the first side;
   a first set of components extending from the first side of the frame and operably coupled to the frame, the first set of components comprising:
      a set of primary power modules, each of the set of primary power modules having a power input, a bus bar power output, and a first communication interface;
      a set of secondary power modules, each of the set of secondary power modules having a bus bar power input, a load output, and a second communication interface; and
      a control module having a third communication interface; and
   a second set of components extending from the second side of the frame and operably coupled to at least one of the frame or the first set of components, the second set of components comprising:
      a common communication backplane having backplane interfaces matching a total number of first, second, and third communication interfaces defined by the first set of components, with the common communication backplane configured to communicate instructions from the control module to the set of primary power modules and the set of secondary power modules; and
      a bus bar electrically connecting at least one bus bar power output to at least one bus bar power input.

2. The modular power distribution assembly of claim 1 wherein a number in the set of primary power modules, a number in the set of secondary power modules, a number of backplane interfaces, and the bus bar are selectable based on power distribution demand.

3. The modular power distribution assembly of claim 1 further comprising a carrier plate carried by the first set of parallel supports.

4. The modular power distribution assembly of claim 3 wherein the second set of components is mounted to at least one of the carrier plate, the frame, or the first set of components.

5. The modular power distribution assembly of claim 3 wherein the first set of components is mounted to at least one of the carrier plate, the frame, or the second set of components.

6. The modular power distribution assembly of claim 3 wherein the carrier plate comprises a plate width matching a width of one of the first set of components.

7. The modular power distribution assembly of claim 3 wherein the carrier plate defines at least a first aperture for a first power connection, a second aperture for a second power connection, and a third aperture for the common communication backplane.

8. The modular power distribution assembly of claim 7, further comprising a first linear row arrangement of at least one of the first aperture or second aperture of each carrier plate and being parallel with the first set of parallel supports, and also comprising a second linear row arrangement of the third apertures of each carrier plate and being parallel with the first set of parallel supports.

9. The modular power distribution assembly of claim 8 wherein the bus bar is selected to match a number of first apertures or a number of second apertures defining the first linear row arrangement.

10. The modular power distribution assembly of claim 8 wherein the communications backplane is selected to match the number of third apertures of the second linear row arrangement.

11. The modular power distribution assembly of claim 1 wherein the second set of parallel supports is configured to mount with a rack assembly.

12. The modular power distribution assembly of claim 1 wherein the first set of components includes a power converter having a bus bar power input and a converted power output.

13. The modular power distribution assembly of claim 1 wherein the second set of components further includes a power input bus bar selected to match the number of the set of primary power modules, with the power input bus bar electrically connecting each of the power inputs of the set of primary power modules and also connectable with a power source.

14. The modular power distribution assembly of claim 1 wherein the second set of components further includes a respective load output connector for each of the secondary power modules, configured to electrically connect each one of the set of secondary power modules with a respective electrical load.

15. The modular power distribution assembly of claim 1 wherein the first set of parallel supports defines opposing distal ends, wherein each of the second set of parallel supports couples a corresponding one of the opposing distal ends.

16. A method of assembling a modular power distribution assembly, the method comprising:
   coupling a first set of components to a first side of a frame defined by at least one set of parallel supports, the first set of components including a set of primary power modules each having a power input, a bus bar power output, and a first communication interface, and also including a set of secondary power modules each having a bus bar power input, a load output, and a second communication interface;
   coupling a second set of components to a second side of the frame, the second set of components including a common communication backplane configured to communicate instructions to the set of primary power modules and the set of secondary power modules, and also including a bus bar electrically connecting at least one bus bar power output to at least one bus bar power input;
   coupling at least one power input of the first set of components to the bus bar; and
   coupling at least one of the first communication interface or the second communication interface of the first set of components to the common communications backplane.

17. The method of claim 16, further comprising mounting at least one carrier plate onto the at least one set of parallel supports.

18. The method of claim 17, further comprising coupling the first set of components and the second set of components to the at least one carrier plate.

19. The method of claim 18, further comprising coupling at least one power input of the first set of components to the bus bar via a corresponding aperture in the carrier plate.

20. The method of claim 18, further comprising coupling at least one communication interface of the first set of components to the common communication backplane via a second corresponding aperture in the carrier plate.

* * * * *